United States Patent
Strang

(10) Patent No.: US 7,199,328 B2
(45) Date of Patent: Apr. 3, 2007

(54) APPARATUS AND METHOD FOR PLASMA PROCESSING

(75) Inventor: Eric J. Strang, Chandler, AZ (US)

(73) Assignee: Tokyo Electron Limited, Tokyo (JP)

(*) Notice: Subject to any disclaimer, the term of this patent is extended or adjusted under 35 U.S.C. 154(b) by 136 days.

(21) Appl. No.: 10/487,232

(22) PCT Filed: Aug. 29, 2002

(86) PCT No.: PCT/US02/25955

§ 371 (c)(1),
(2), (4) Date: Feb. 26, 2004

(87) PCT Pub. No.: WO03/021002

PCT Pub. Date: Mar. 13, 2003

(65) Prior Publication Data

US 2004/0195216 A1    Oct. 7, 2004

Related U.S. Application Data

(60) Provisional application No. 60/315,369, filed on Aug. 29, 2001.

(51) Int. Cl.
*B23K 10/00* (2006.01)
(52) U.S. Cl. .......................... 219/121.43; 219/121.55; 219/121.57; 156/345.44; 118/723 I
(58) Field of Classification Search ............ 219/121.43, 219/121.4, 121.55, 121.54, 121.57, 121.41; 156/345.44, 345.48; 118/723 I
See application file for complete search history.

(56) References Cited

U.S. PATENT DOCUMENTS

| | | | |
|---|---|---|---|
| 4,401,507 A | 8/1983 | Engle | |
| 4,824,690 A * | 4/1989 | Heinecke et al. | 427/577 |
| 4,891,087 A | 1/1990 | Davis et al. | |
| 4,935,661 A * | 6/1990 | Heinecke et al. | 313/231.31 |
| 5,529,657 A * | 6/1996 | Ishii | 156/345.26 |
| 5,785,796 A | 7/1998 | Lee | |
| 5,859,501 A * | 1/1999 | Chi | 315/111.21 |
| 5,997,687 A | 12/1999 | Koshimizu | |
| 6,110,287 A | 8/2000 | Arai et al. | |
| 6,129,806 A | 10/2000 | Kaji et al. | |
| 6,200,651 B1 * | 3/2001 | Roche et al. | 427/571 |
| 6,449,871 B1 * | 9/2002 | Kholodenko et al. | 34/255 |
| 6,589,437 B1 * | 7/2003 | Collins | 216/68 |
| 6,764,546 B2 * | 7/2004 | Raaijmakers | 117/93 |
| 6,784,108 B1 * | 8/2004 | Donohoe et al. | 438/706 |
| 2004/0214451 A1 * | 10/2004 | Johnson | 438/788 |

\* cited by examiner

*Primary Examiner*—Mark Paschall
(74) *Attorney, Agent, or Firm*—Oblon, Spivak, McClelland, Maier & Neustadt, P.C.

(57) ABSTRACT

A plasma processing system including a process chamber, a substrate holder provided within the process chamber, and a gas injection system configured to supply a first gas and a second gas to the process chamber. The system includes a controller that controls the gas injection system to continuously flow a first gas flow to the process chamber and to pulse a second gas flow to the process chamber at a first time. The controller pulses a RF power to the substrate holder at a second time. A method of operating a plasma processing system is provided that includes adjusting a background pressure in a process chamber, where the background pressure is established by flowing a first gas flow using a gas injection system, and igniting a processing plasma in the process chamber. The method includes pulsing a second gas flow using the gas injection system at a first time, and pulsing a RF power to a substrate holder at a second time.

45 Claims, 3 Drawing Sheets

APPARATUS AND METHOD FOR PLASMA PROCESSING

CROSS-REFERENCE TO RELATED APPLICATION

This application claims priority to U.S. provisional application Ser. No. 60/315,369, filed on Aug. 29, 2001, the entire contents of which are herein incorporated by reference.

BACKGROUND OF THE INVENTION

1. Field of Invention

The present invention relates to plasma processing and more particularly to a method for improved plasma processing.

2. Description of Related Art

Typically, during materials processing, plasma is employed to facilitate the addition and removal of material films when fabricating composite material structures. For example, in semiconductor processing, a (dry) plasma etch process is utilized to remove or etch material along fine lines or within vias or contacts patterned on a silicon substrate. The plasma etch process generally involves positioning a semiconductor substrate with an overlying patterned, protective layer, for example a photoresist layer, into a processing chamber. Once the substrate is positioned within the chamber, an ionizable, dissociative gas mixture is introduced within the chamber at a pre-specified flow rate, while a vacuum pump is throttled to achieve an ambient process pressure.

Thereafter, a plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, any exposed surfaces of the substrate are etched by the plasma. The process is adjusted to achieve optimal conditions, including an appropriate concentration of desirable reactant and ion populations to etch various features (e.g., trenches, vias, contacts, etc.) in the exposed regions of the substrate. Such substrate materials where etching is required include silicon dioxide ($SiO_2$), poly-silicon and silicon nitride.

As the feature size shrinks and the number and complexity of the etch process steps used during integrated circuit (IC) fabrication escalate, the ability to control the transport of reactive materials to and effluent etch products from etch features, in order to achieve the proper chemical balance necessary to attain high etch rates with good material selectivity, becomes more stringent.

The etch rate in most dry etch applications, for example oxide ($SiO_2$) etch, includes a physical component and a chemical component. The plasma chemistry creates a population of positively charged (relatively heavy) ions (such as singly charged argon ions) utilized for the physical component and a population of chemical radicals (such as atomic fluorine F, and CF, $CF_2$, $CF_3$ or more generally $CF_x$ species in a fluorocarbon plasma) utilized for the chemical component. Moreover, the chemical reactants ($CF_x$) act as reactants in the surface etch chemistry and the (heavy) positively charged ions (Ar+) provide energy to catalyze the surface reactions.

As feature sizes progressively shrink, they do so at a rate greater than a rate at which the oxide (and other film) thicknesses shrink. Therefore, the etch feature aspect ratio (feature depth-to-width) is greatly increased with shrinking sizes (of order 10:1). As the aspect ratio increases, the directionality of chemical reactant and ion transport local to the etch features becomes increasingly important in order to preserve the anisotropy of the etch feature.

The transport of electrically charged species (such as ions) can be affected by an electric force and, therefore, it is conventional in the industry to provide a substrate holder (chuck) with a RF bias to attract and accelerate ions to the substrate surface through the plasma sheath such that they arrive moving in a direction substantially normal to the substrate surface. However, the transport of neutral, chemically reactive species is not amenable to the application of an electric force to assert their directionality at the substrate surface.

SUMMARY OF THE INVENTION

The present invention provides a plasma processing system and method of operation to affect improvements in chemical transport local to an exposed substrate surface in order to improve etch rate, etch selectivity and etch feature side-wall profile particularly in high aspect ratio features. The exposed substrate surface is exposed to either material etch or deposition steps, the combination of which serve to alter the material composition and/or topography of the exposed substrate surface.

The present invention advantageously provides a plasma processing system including a process chamber, a substrate holder provided within the process chamber, and a gas injection system configured to supply a first gas and a second gas to the process chamber. The system further includes a controller configured to control the gas injection system to continuously flow a first gas flow to the process chamber and to pulse a second gas flow to the process chamber at a first time. The controller is configured to pulse a RF power to the substrate holder at a second time.

The present invention further advantageously provides a method of operating a plasma processing system. The method includes the steps of adjusting a background pressure in a process chamber, wherein the background pressure is established by flowing a first gas flow using a gas injection system, and igniting a processing plasma in the process chamber. The method further includes the steps of pulsing a second gas flow using the gas injection system at a first time, and pulsing a RF power to a substrate holder at a second time.

BRIEF DESCRIPTION OF THE DRAWINGS

These and other objects and advantages of the invention will become more apparent and more readily appreciated from the following detailed description of the exemplary embodiments of the invention taken in conjunction with the accompanying drawings, where.

DETAILED DESCRIPTION OF PREFERRED EMBODIMENTS

In order to improve etch rate, etch selectivity and etch feature side-wall profile particularly in high aspect ratio features, the present invention improves a plasma processing system and method of operation to affect improvements in chemical transport local to an exposed substrate surface. The exposed substrate surface is exposed to either material etch or deposition steps, the combination of which serve to alter the material composition and/or topography of the exposed substrate surface. One aspect of material etch and deposition is chemical transport, which can be severely limited in high aspect ratio features due to the low densities associated with low pressure processing and lack of chemical transport directivity local to substrate material features. A method is described herein of periodically pulsing a gas flow in conjunction with pulsing the RF power to the substrate holder in order to affect improvements to chemical transport proximate the substrate.

Pulsing the gas flow leads to an increase of the gas pressure proximate an exposed surface of a substrate, hence, causing a local reduction in the mean free path, i.e. an increase in the probability for collisions local to the substrate surface. Pulsing the RF power to the substrate holder leads to an increase in the potential drop across the sheath for a duration characteristic of the pulse width during which the sheath thickness is enlarged. The subsequent reduction of the mean free path to values less than the sheath thickness leads to a significantly greater probability during this short period of time for ion-neutral collisions, either charge exchange collisions or simply momentum transfer collisions, which, in turn, create a greater population of energetic, directional neutral species moving in a direction of normal incidence to the substrate surface. Therefore, the normal flux of mass and momentum is increased at a feature entrance. The plasma processing system and its method of operation according to the present invention is now described.

The present invention generally relates to a plasma processing system including a gas injection system capable of continuously providing a first process gas through a first array of gas injection orifices and pulsing a second process gas through a second array of gas injection orifices. The processing system further includes a RF bias applied to a substrate holder upon which a substrate rests. The substrate is exposed to a plasma process to facilitate an addition (deposition) or a removal (etching) of a material to or from the substrate.

Figure 1:
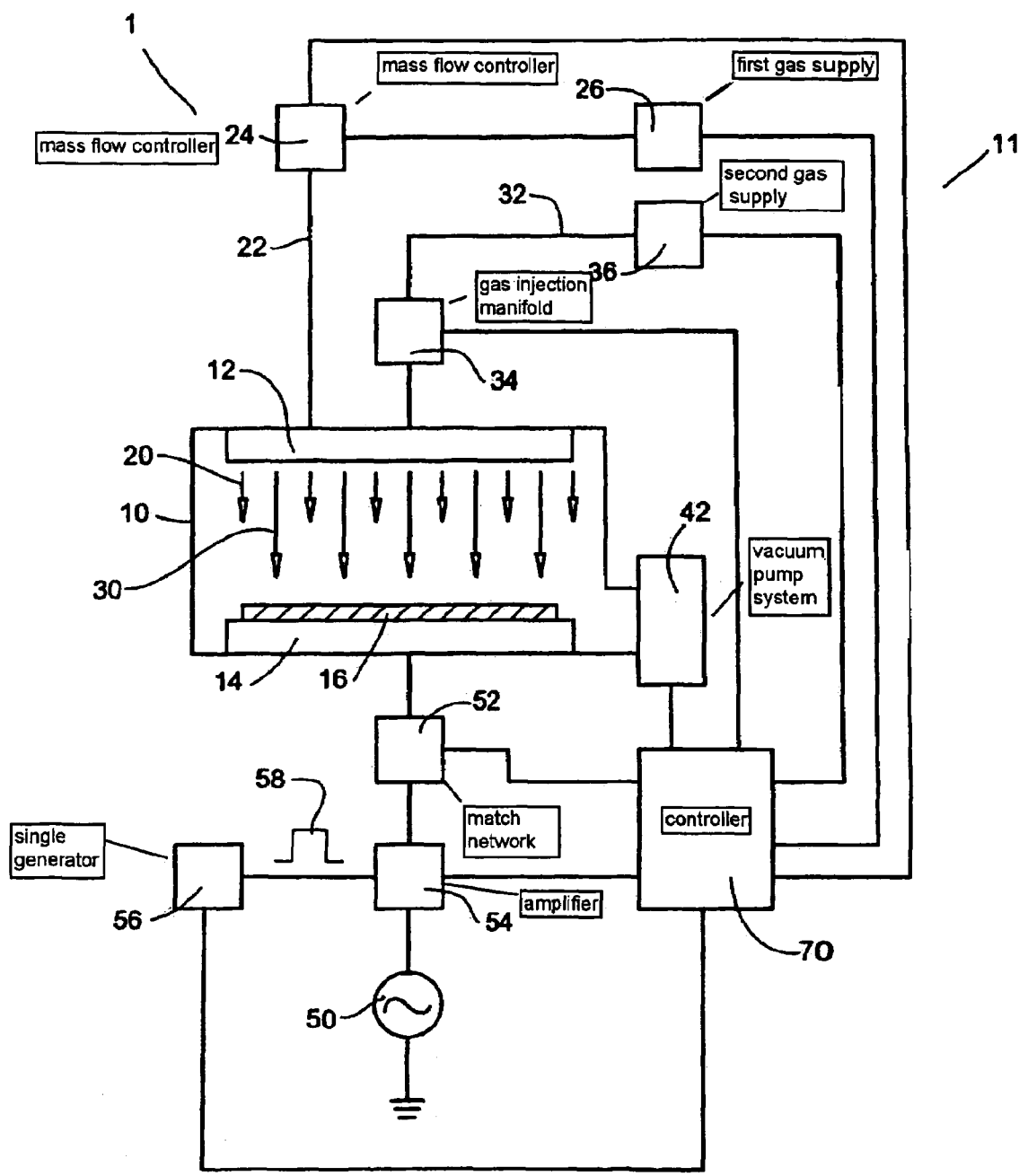
FIG. 1 depicts a schematic view of a plasma processing device according to an embodiment of the present invention.

A plasma processing system 1 is shown in FIG. 1 including a plasma processing chamber 10 wherein a gas injection plate 12 of gas injection system 11 is positioned directly opposite a substrate holder 14 to which a substrate 16 is attached. The gas injection system 11 facilitates a continuous injection of a first gas flow 20 and a pulsed injection of a second gas flow 30 into plasma processing chamber 10 through gas injection plate 12. The continuous flow of the first gas flow 20 originates from a first gas supply 26 through a mass flow controller 24 via a gas line 22. The pulsed flow of the second gas flow 30 originates from a second gas supply 36 through a pulsed gas injection manifold 34 via a gas line 32.

The processing system 1 of FIG. 1 further includes a RF bias originating from oscillator 50 and applied to substrate holder 14 through impedance match network 52.

An amplifier 54 increases the amplitude of RF bias signal output from oscillator 50 subject to amplitude modulation via signal 58 output from waveform signal generator 56. The amplifier 54 sends the amplified RF bias signal to the impedance match network 52.

With continuing reference to FIG. 1, substrate holder 14 is biased with RF power, wherein an RF signal originating from oscillator 50 is coupled to substrate holder 14 through impedance match network 52 and amplifier 54. Signal amplification is subjected to amplitude modulation via input signal 58 from a waveform signal generator 56.

The amplifier 54 can be a linear RF amplifier suitable for receiving an oscillator input from oscillator 50 and an amplitude modulation signal 58 from waveform signal generator 56. One example of a signal 58 output from waveform signal generator 56 is a pulse waveform. An exemplary system including the amplifier 54 and an internal pulse generator is a commercially available linear RF amplifier (Model line LPPA) from Dressler (2501 North Rose Drive, Placentia, Calif. 92670). The above amplifier is capable of operating in continuous mode as well as pulse mode with RF powers ranging from 400 to 8000 W at frequencies ranging from 10 to 500 MHz. Moreover, the above amplifier can achieve pulse widths as short as 20 milliseconds.

Impedance match network 52 serves to maximize the transfer of RF power to plasma in processing chamber 10 by minimizing the reflected power. Match network topologies (e.g. L-type, $\pi$-type, T-type, etc.) for achieving this end are known. Match network settings for tuning capacitors C1 and C2 in, for example, an L-type configuration, are controlled via controller 70 during both start and run-time conditions. Preferably, an automatic match network control methodology is employed to maintain optimal match throughout the entirety of the process. However, the response for typical match networks is approximately 150 milliseconds. Therefore, it is not expected that a conventional (mechanically tuned) match network can respond optimally to pulse widths less than approximately 150 milliseconds. In such a case, a conventional match network is designed for run and start set-points based upon the continuous flow process gas conditions. If on the other hand, pulse widths in excess of several hundred milliseconds are employed, conventional match networks are sufficiently fast to respond and provide an optimal impedance match even during pulsing periods. Further discussion is provided below.

Additionally, the processing system 1 of FIG. 1 further includes a vacuum pump system 42 through which process gases and effluent gases can be removed (or evacuated) from plasma processing chamber 10. Vacuum pump system 42 preferably includes a turbo-molecular vacuum pump (TMP) capable of a pumping speed up to 5000 liters per second (and greater) and a gate valve for throttling the chamber pressure. TMPs are useful for low pressure processing, typically less than 50 mTorr. At higher pressures, the TMP pumping speed falls off dramatically. For high pressure processing (i.e. greater than 100 mTorr), a mechanical booster pump and dry roughing pump is recommended.

Furthermore, the plasma processing system 1 further includes a controller 70 coupled to vacuum pump system 42, impedance match network 52, amplifier 54 and waveform signal generator 56. In addition, controller 70 is coupled to mass flow controller 24, first gas supply 26, second gas supply 36 and pulsed gas injection manifold 34 for the purpose of controlling gas injection parameters in the plasma processing system 1.

Controller 70 includes a microprocessor, memory, and a digital I/O port capable of generating control voltages sufficient to communicate and activate inputs to the gas injection system 11. Moreover, controller 70 exchanges information with impedance match network 52, amplifier 54, and waveform signal generator 56. The controller 70 exchanges status data with the gas supplies 26 and 36, mass flow controller 24, and pulsed gas injection manifold 34. In addition, controller 70 sends and receives control signals to and from vacuum pump 55. For example, a gate valve can be controlled. A program stored in the memory includes a process recipe with which to activate the valves and the respective gas flow rate when desired. One example of controller 70 is a Model #SBC2486DX PC/104 Embeddable Computer Board commercially available from Micro/sys, Inc., 3730 Park Place, Glendale, Calif. 91020.

During the operation of the plasma processing system 1, process gas is introduced to the plasma processing chamber 10 via gas injection system 11 wherein means are provided for continuously flowing the first gas flow 20 and means are provided for pulsing the second gas flow 30. First and second gas flows 20 and 30 originate from gas supplies 26 and 36, respectively. Gas supplies 26 and 36 can include a cabinet housing a plurality of compressed gas cylinders and can include pressure regulators for safe gas handling practice. The continuous flow of first gas flow 20 is achieved via a gas showerhead configuration that is well known to those skilled in the art.

In a preferred embodiment, continuous flow of first gas flow 20 is introduced to the process chamber 10 through gas injection plate 12. In an alternate embodiment, continuous flow of gas flow 20 is introduced to the process chamber 10 through a chamber wall of the process chamber 10. In a preferred embodiment, mass flow controller 24 monitors and controls the mass flow rate of the first process gas being supplied by gas supply 26. The pulsing of second gas 30 is achieved via pulsed gas injection manifold 34. The pulsed gas injection manifold 34 can include one or more pressure regulators, one or more pulsed gas injection valves and a gas distribution manifold. An exemplary pulsed gas injection system is described in greater detail in pending U.S. application 60/272,452, filed on Mar. 2, 2001, which is incorporated herein by reference in its entirety. In a preferred embodiment, pulsed flow of second gas flow 30 is introduced to process chamber 10 through gas injection plate 12.

In alternate embodiments, gas injection plate 12 can be machined from a metal such as aluminum and, for those surfaces in contact with the plasma, can be anodized to form an aluminum oxide protective coating or spray coated with $Y_2O_3$. Furthermore, the gas inject plate 12 can be fabricated from silicon or carbon to act as a scavenging plate, or it can be fabricated from silicon carbide to promote greater erosion resistance.

Substrate 16 is transferred into and out of plasma processing chamber 10 by means well understood to those skilled in the art. Furthermore, substrate 16 is preferably affixed to the substrate holder 14 via electrostatic clamp (not shown) and backside gas (not shown) can be provided for improved thermal conductance between substrate 16 and substrate holder 14. Substrate holder 14 can further include heating and cooling means (not shown) in order to facilitate temperature control of substrate 16.

Figure 2:
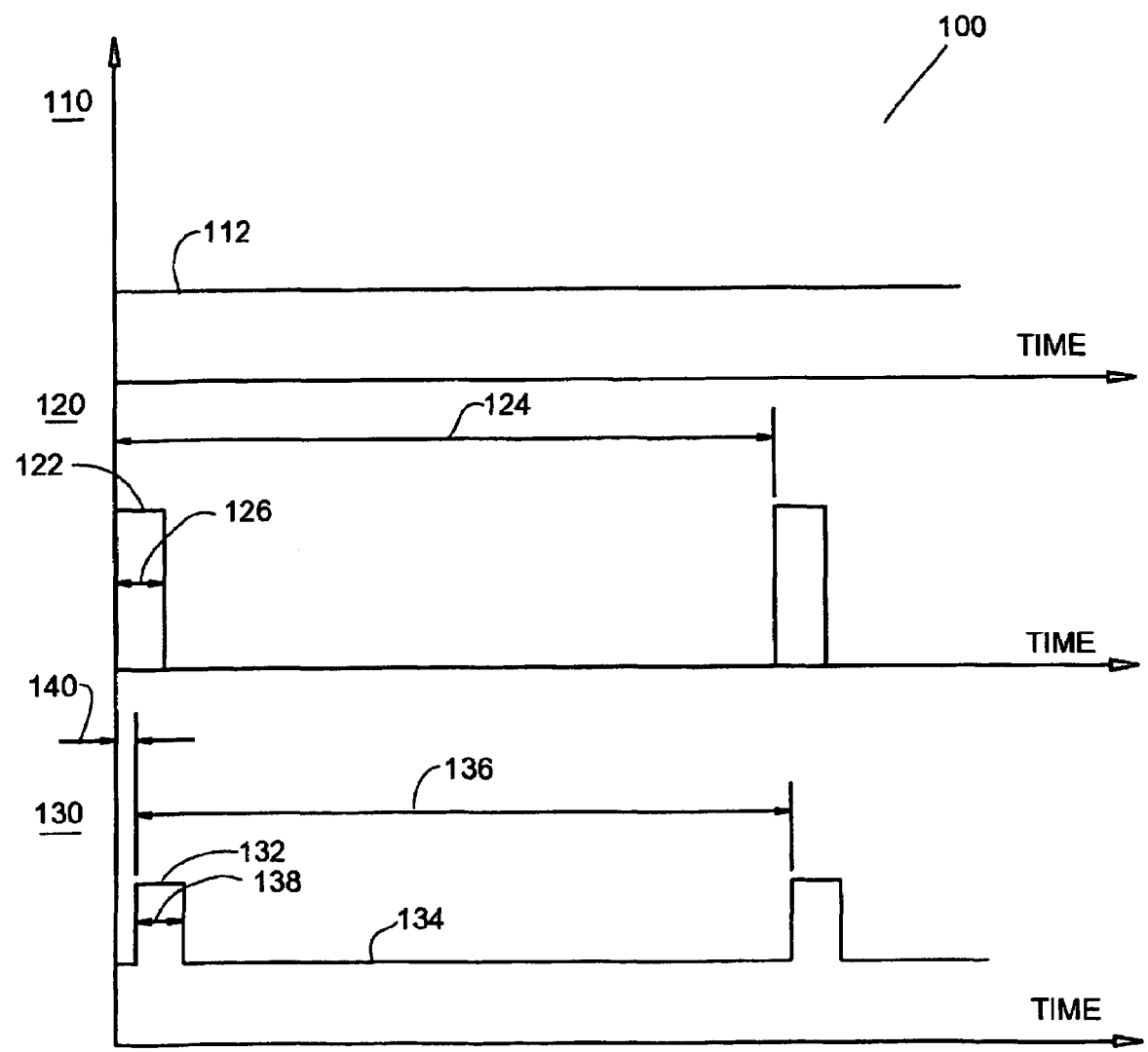
FIG. 2 is a timing diagram for gas injection pulsing and RF bias pulsing according to the embodiment of FIG. 1.

FIG. 2 presents a schematic illustration of a method of operating the embodiment described in FIG. 1. A first time history of a flow rate of the first gas flow 20, generally indicated as 110, is shown, wherein the flow rate 112 is maintained constant during the length of the process. A second time history of a flow property of the second gas flow 30, generally indicated as 120, is shown, wherein the flow property 122 is preferably an injection total pressure. The injection total pressure is pulse modulated via pulsed gas injection manifold 34 with a pulse amplitude 122, pulse width 126 and pulse period 124. A ratio of the pulse width 126 to the pulse period 124 can further be referred to as the pulse duty cycle. In addition, the pulsed flow property 122 can be a mass flow rate of the second gas flow 30.

In concert with the first and second time histories, a third time history of the RF bias power, generally indicated as 130, is shown, wherein the RF bias power is pulse modulated between a first power level 134 and a second power level 132. The RF bias power pulse has a pulse width 138 and a pulse period 136. A ratio of the pulse width 138 to the pulse period 136 can be further referred to as the pulse duty cycle. In a preferred embodiment, the RF power pulse width 138 and pulse period 136 are substantially equivalent to the second process gas pulse width 122 and pulse period 124, respectively. In an alternate embodiment, the RF power pulse duty cycle is substantially equivalent to the second gas flow pulse duty cycle. In an alternate embodiment, the second gas flow pulse width is substantially different than the RF power pulse width. In an alternate embodiment, the second gas flow pulse period is substantially different than the RF power pulse period. In an alternate embodiment, the second gas flow duty cycle is substantially different than the RF power pulse duty cycle. In a further alternate embodiment, the RF power pulse waveform is shifted or offset in time 140 relative to the second gas flow gas pulse waveform.

The flow rate of the first gas flow 20 can range from 100 to 5000 sccm (equivalent argon flow rate). A chamber pressure can range from 1 to 1000 mTorr. The injection total pressure of the second gas flow 30 gas can range from 50 to 1000 Torr. The pulse widths can range from 1 to 1000 milliseconds with pulse periods ranging from 10 milliseconds to 10 seconds.

In a preferred embodiment, a process recipe according to the method of operation presented in FIG. 2 is now described. The first gas flow 20 includes a gas mixture of Ar/C4F8/O2 with corresponding flow rates 400/7/12 sccm. A background pressure in process chamber 10 is set to 20 mTorr, for example, by sensing the chamber pressure in the pumping port or at the chamber wall outside of the processing region and adjusting the vacuum pump system gate valve. The second gas flow 30 is a mixture of gases Ar/C4F8/O2 with corresponding partial pressures substantially equivalent to those of the first gas flow 20. The gas injection total pressure for the second gas flow 30 is preferably atmospheric pressure (i.e. approximately 760 Torr). And lastly, pulse widths and pulse periods are substantially equivalent for the second gas flow pulse and the RF power pulse and are set at 20 milliseconds and 200 milliseconds, respectively.

In the preferred method of operation, process gas pulse widths of 20 milliseconds are achieved via gas injection configurations presented in pending U.S. application 60/272,452, and RF power pulse widths of 20 milliseconds are achieved via commercially available RF power sources as described above. Also described above, when RF power pulse widths are less than the response time of conventional impedance match networks (i.e. approximately 150 milliseconds), alternative techniques could be required to achieve an optimal impedance match. Linear RF amplifiers, as described above, are now being equipped with frequency shift tuning and, in particular, they are available for frequencies of 1.6 to 4 MHz (Dressler RF Technology). For frequencies in excess of commercially viable options, one requires alternative solutions such as a free running oscillator as described in pending U.S. application 60/143,548 filed on Jul. 13, 1999, which is incorporated herein by reference in its entirety.

Figure 3:
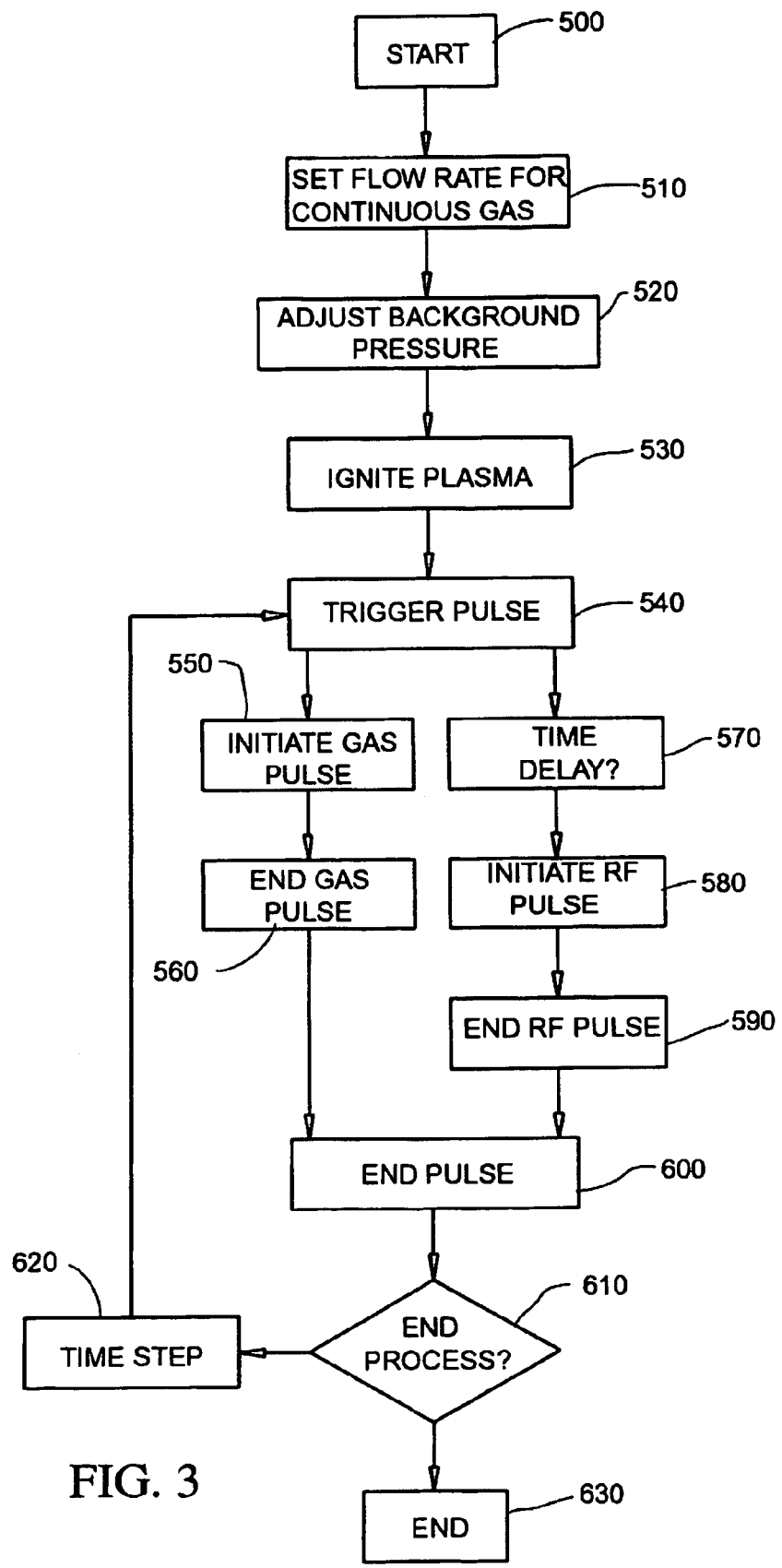
FIG. 3 outlines a procedure for operating the system of FIG. 1 according to the embodiment of FIG. 1.

In FIG. 3, a method of operating the embodiment depicted in FIG. 1 is presented. A plasma process is initiated in plasma processing system 1 at step 500. In step 510, controller 70 initiates a flow rate 112 for the first gas flow 20 through gas injection system 11 according to a stored process recipe. The first gas flow 20 is continuously introduced to process chamber 10 with a constant mass flow rate 112 from the start of the process in step 500 until the end of the process in step 630. In step 520, controller 70, coupled to vacuum pump system 42, adjusts the background pressure in process chamber 10 according to a stored process recipe.

Once the first process gas flow rate is established and the background pressure is set, a processing plasma is ignited via substrate holder RF power in step 530 according to a process recipe stored in controller 70. In step 540, controller 70 triggers second gas flow pulse in step 550 and RF power pulse in step 580 with or without a phase delay in step 570. The second gas flow pulse is ended in step 560 while the RF power pulse is ended in step 590, and the process pulse is completed in step 600.

In step 610, a process endpoint is evaluated per endpoint detection methods such as optical emission spectroscopy, impedance match network component monitoring, etc. If an endpoint is reached, the process comes to an end in step 630. If the process is not complete, a time delay comparable to the respective pulse periods for the second process gas pulse and the RF power pulse is enforced in step 620. Thereafter, steps 540 through 630 are repeated.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A plasma processing system comprising:
   a process chamber;
   a substrate holder provided within said process chamber;
   a gas injection system configured to supply a first gas and a second gas to said process chamber; and
   a controller configured to control said gas injection system to continuously flow a first gas flow to said process chamber and to pulse a second gas flow to said process chamber at a first time, said controller being configured to pulse a RF power to said substrate holder at a second time, and said controller is configured to provide a pulse width of said second gas flow that is substantially equivalent to a pulse width of said RF power pulse.

2. The system according to claim 1, wherein a gas injection plate of said gas injection system is substantially parallel to a substrate receiving surface of said substrate holder, and wherein said gas injection plate is configured to introduce at least one of said first gas flow and said second gas flow into said process chamber in a direction substantially normal to said substrate receiving surface of said substrate holder.

3. The system according to claim 1, wherein said controller is configured to provide a pulse period of said second gas flow that is substantially equivalent to a pulse period of said RF power pulse.

4. A plasma processing system comprising:
   a process chamber;
   a substrate holder provided within said process chamber;
   a gas injection system configured to supply a first gas and a second gas to said process chamber; and
   a controller configured to control said gas injection system to continuously flow a first gas flow to said process chamber and to pulse a second gas flow to said process chamber at a first time, said controller being configured to pulse a RF power to said substrate holder at a second time, and said controller is configured to provide a pulse duty cycle of said second gas flow that is substantially equivalent to a pulse duty cycle of said RF power pulse.

5. The system according to claim 1, wherein said controller is configured to provide that said first time of said pulse of second gas flow is substantially equivalent to said second time of said pulse of RF power.

6. The system according to claim 1, wherein said controller is configured to provide that said first time of said pulse of second gas flow is offset from said second time of said pulse of RF power.

7. The system according to claim 1, wherein said controller is configured to adjust a background pressure in said process chamber.

8. The system according to claim 1, further comprising an oscillator coupled to said substrate holder for providing said RF power, said oscillator producing an RE signal.

9. The system according to claim 8, further comprising an amplifier coupled to said oscillator.

10. The system according to claim 9, wherein said amplifier is a linear amplifier.

11. The system according to claim 9, further comprising an impedance match network connecting said amplifier to said substrate holder.

12. The system according to claim 11, wherein said controller is connected to and configured to control said amplifier and said impedance match network.

13. The system according to claim 9, further comprising a waveform generator configured to produce an input signal and coupled to said amplifier, wherein said RF signal is received by said amplifier and wherein said RF signal is subjected to amplitude modulation via said input signal received by said amplifier from said waveform generator.

14. The system according to claim 13, wherein said input signal is a pulse waveform.

15. The system according to claim 13, wherein said controller is connected to and configured to control said waveform generator.

16. The system according to claim 1, said gas injection system comprising a first gas supply connected to a mass flow controller, and a second gas supply connected to a pulsed gas injection manifold.

17. The system according to claim 16, wherein said pulsed gas injection manifold comprises a pressure regulator, a pulsed gas injection valve, and a gas distribution manifold.

18. The system according to claim 16, said controller being connected to and configured to control said first gas supply, said mass flow controller, said second gas supply, and said pulsed gas injection manifold.

19. A plasma processing system comprising:
   a process chamber;
   a substrate holder provided within said process chamber;
   a gas injection system configured to supply a first gas and a second gas to said process chamber; and
   control means for providing a continuous first gas flow to said process chamber through said gas injection system, pulses of a second gas flow to said process chamber through said gas injection system at a first time, and pulses of a RF power to said substrate holder at a second time, and said control means is configured to provide a pulse width of said second gas flow that is substantially equivalent to a pulse width of said RF power pulse.

20. The system according to claim 19, wherein a gas injection plate of said gas injection system is substantially parallel to a substrate receiving surface of said substrate holder, and wherein said gas injection plate is configured to introduce at least one of said first gas flow and said second gas flow into said process chamber in a direction substantially normal to said substrate receiving surface of said substrate holder.

21. The system according to claim 19, wherein said control means is configured to provide a pulse period of said second gas flow that is substantially equivalent to a pulse period of said RF power pulse.

22. A plasma processing system comprising:
a process chamber;
a substrate holder provided within said process chamber;
a gas injection system configured to supply a first gas and a second gas to said process chamber; and
control means for providing a continuous first gas flow to said process chamber through said gas injection system, pulses of a second gas flow to said process chamber through said gas injection system at a first time, and pulses of a RF power to said substrate holder at a second time, and said control means is configured to provide a pulse duty cycle of said second gas flow that is substantially equivalent to a pulse duty cycle of said RF power pulse.

23. The system according to claim 19, wherein said control means is configured to provide that said first time of said pulse of second gas flow is substantially equivalent to said second time of said pulse of RF power.

24. The system according to claim 19, wherein said control means is configured to provide that said first time of said pulse of second gas flow is offset from said second time of said pulse of RF power.

25. The system according to claim 19, wherein said control means is configured to adjust a background pressure in said process chamber.

26. The system according to claim 19, further comprising an oscillator coupled to said substrate holder for providing said RF power, said oscillator producing an RF signal.

27. The system according to claim 26, further comprising an amplifier coupled to said oscillator.

28. The system according to claim 27, wherein said amplifier is a linear amplifier.

29. The system according to claim 27, further comprising an impedance match network connecting said amplifier to said substrate holder.

30. The system according to claim 29, wherein said control means is connected to and configured to control said amplifier and said impedance match network.

31. The system according to claim 27, further comprising a waveform generator configured to produce an input signal and coupled to said amplifier, wherein said RF signal is received by said amplifier and wherein said RF signal is subjected to amplitude modulation via said input signal received by said amplifier from said waveform generator.

32. The system according to claim 31, wherein said input signal is a pulse waveform.

33. The system according to claim 31, wherein said control means is connected to and configured to control said waveform generator.

34. The system according to claim 19, said gas injection system comprising a first gas supply connected to a mass flow controller, and a second gas supply connected to a pulsed gas injection manifold.

35. The system according to claim 34, wherein said pulsed gas injection manifold comprises a pressure regulator, a pulsed gas injection valve, and a gas distribution manifold.

36. The system according to claim 34, said control means being connected to and configured to control said first gas supply, said mass flow controller, said second gas supply, and said pulsed gas injection manifold.

37. A method of operating a plasma processing system, the method comprising the steps of:
adjusting a background pressure in a process chamber, wherein the background pressure is established by flowing a first gas flow using a gas injection system;
igniting a processing plasma in the process chamber;
pulsing a second gas flow using the gas injection system at a first time for a first pulse width; and
pulsing a RF power to a substrate holder at a second time for a second pulse width, wherein said first pulse width being substantially equivalent to said second pulse width.

38. The method according to claim 37, wherein the step of pulsing the second gas flow is performed for a predetermined pulse period.

39. The method according to claim 37, wherein the step of pulsing the second gas flow is performed to achieve a predetermined pulse duty cycle.

40. The method according to claim 37, wherein the step of pulsing the RF power is performed for a predetermined pulse period.

41. The method according to claim 37, wherein the step of pulsing the RF power is performed to achieve a predetermined pulse duty cycle.

42. The method according to claim 37, wherein the step of pulsing the second gas flow is performed for a first pulse period, and wherein the step of pulsing the RF power is performed for a second pulse period, said first pulse period being substantially equivalent to said second pulse period.

43. A method of operating a plasma processing system, the method comprising the steps of:
adjusting a background pressure in a process chamber, wherein the background pressure is established by flowing a first gas flow using a gas injection system;
igniting a processing plasma in the process chamber;
pulsing a second gas flow using the gas injection system at a first time for a first pulse duty cycle; and
pulsing a RF power to a substrate holder at a second time for a second pulse duty cycle, said first pulse duty cycle being substantially equivalent to said second pulse duty cycle.

44. The method according to claim 37, wherein the first time of the pulse of second gas flow is substantially equivalent to the second time of the pulse of RE power.

45. The method according to claim 37, wherein the first time of the pulse of second gas flow is offset from the second time of the pulse of RF power.

* * * * *